(12) United States Patent
Miyake et al.

(10) Patent No.: US 8,703,506 B2
(45) Date of Patent: Apr. 22, 2014

(54) SOLAR CELL MODULE MANUFACTURING DEVICE AND SOLAR CELL MODULE MANUFACTURING METHOD

(75) Inventors: Takafumi Miyake, Ise (JP); Koki Oda, Ise (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/819,939

(22) PCT Filed: Aug. 30, 2011

(86) PCT No.: PCT/JP2011/069665
§ 371 (c)(1),
(2), (4) Date: Feb. 28, 2013

(87) PCT Pub. No.: WO2012/029813
PCT Pub. Date: Mar. 8, 2012

(65) Prior Publication Data
US 2013/0164863 A1    Jun. 27, 2013

(30) Foreign Application Priority Data

Aug. 30, 2010   (JP) .................................. 2010-192206

(51) Int. Cl.
*H01L 31/18*  (2006.01)
*B21F 3/00*  (2006.01)

(52) U.S. Cl.
USPC ........................................... 438/6; 140/71 C

(58) Field of Classification Search
None
See application file for complete search history.

(56) References Cited

U.S. PATENT DOCUMENTS

2011/0092053 A1*  4/2011  Miyake et al. ................ 438/460

FOREIGN PATENT DOCUMENTS

| JP | H05-003489 Y2 | 1/1993 |
|---|---|---|
| JP | 2007-173618 A | 7/2007 |
| JP | 2008-284560 A | 11/2008 |
| JP | 2009-164212 A | 7/2009 |

OTHER PUBLICATIONS

International Search Report dated Nov. 22, 2011, issued for International Application No. PCT/JP2011/069665.

* cited by examiner

*Primary Examiner* — Seahvosh Nikmanesh
(74) *Attorney, Agent, or Firm* — Procopio, Cory, Hargreaves & Savitch LLP

(57)  ABSTRACT

A solar cell module manufacturing device is disclosed. The device includes a wire supply portion, a correction portion, and a cutting portion. The supply portion includes a bobbin and wiring material on the bobbin. The correction portion corrects curvature of the wiring material. The correction portion comprises a first pulley that comes in contact with the wiring material which is drawn from the bobbin. The first pulley comprises at a periphery thereof a first groove. The first groove comprises a first basal surface and a pair of first inclined surfaces which are arranged on both sides of the first basal surface. An inclination angle θ1 of the first inclined surface relative to the first basal surface being less than or equal to an inclination angle θ2 of the wiring material which is drawn from the supply portion relative to the first basal surface.

18 Claims, 10 Drawing Sheets

SOLAR CELL MODULE MANUFACTURING DEVICE AND SOLAR CELL MODULE MANUFACTURING METHOD

TECHNICAL FIELD

The present invention relates to a solar cell module manufacturing device and a solar cell module manufacturing method.

BACKGROUND ART

A solar cell module includes a plurality of solar cell elements and interconnectors that electrically connect that plurality of solar cell elements.

As disclosed in Japanese Patent Application Publication Kokai No. 2009-164212, and the like, such an interconnector may be formed by causing wiring material, which is wound on a bobbin, to be drawn from the bobbin, to be traveled past a plurality of pulleys, and then to be cut to desired length.

At this time, the wiring material is made to move in the axial direction of the bobbin as it is wound about the winding surface of the bobbin. For this reason, when the wiring material is drawn from the bobbin as well, the winding surface will likewise move in reciprocating fashion in the axial direction of the bobbin as the wiring material is drawn therefrom.

In addition, for a manufacturing device disclosed in Japanese Patent Application Publication Kokai No. 2009-164212, a pulley arranged downstream from a bobbin includes at the periphery thereof a groove which has a rectangular cross-section. With pulleys such as the foregoing, it has sometimes been the case that stresses which tend to produce in-plane bending in wiring material drawn from the bobbin have acted thereon and have caused occurrence of folding in the in-plane direction therein. That is, where a manufacturing device such as that disclosed in Japanese Patent Application Publication Kokai No. 2009-164212 has been used, there have been cases in which the interconnector formed by cutting wiring material which has traveled past the aforementioned pulley has exhibited folding in the in-plane direction in a planar view.

Note that, here and below, bending in a plane which contains the principal plane of the wiring material is referred to as in-plane bending, and a direction parallel to a plane which contains the principal plane of the wiring material and perpendicular to the length direction of the wiring material is referred to as the in-plane direction. Furthermore, bending in a direction perpendicular to a plane which contains the principal plane of the wiring material is referred to as out-of-plane bending, and a direction perpendicular to a plane which contains the principal plane of the wiring material is referred to as the out-of-plane direction.

Where an interconnector having such curvature in the in-plane direction has been used to connect a plurality of solar cell elements, there has been a possibility that the interconnector is arranged so as to protrude out of the output electrodes of the solar cell elements. As a result, there have been cases where the effective light-receiving surface area of the light-receiving surfaces of the solar cell elements has been lowered and efficiency of electric power generation has been reduced.

Accordingly, in the context of a device and method for manufacturing a solar cell module in which an interconnector is used to electrically connect a plurality of solar cell elements, improved efficiency of electric power generation and improved reliability of the solar cell module have been sought.

SUMMARY OF INVENTION

A solar cell module manufacturing device according to an embodiment of the present invention includes: a supply portion that draws wiring material from a bobbin on which the wiring material is wound; a correction portion that corrects curvature of the wiring material which has been drawn from the supply portion; and a cutting portion that cuts the wiring material, which has been corrected, to prescribed length to form an interconnector. The correction portion includes a first pulley that comes in contact with the wiring material which is drawn from the bobbin. The first pulley includes at a periphery thereof a first groove including: a first basal surface; and a pair of first inclined surfaces which are arranged to both sides of the first basal surface. An inclination angle $\theta_1$ of the first inclined surface relative to the first basal surface is less than or equal to an inclination angle $\theta_2$ of the wiring material which is drawn from the supply portion relative to the first basal surface.

A solar cell module manufacturing method according to an embodiment of the present invention includes: a supply step in which wiring material is drawn from a bobbin on which the wiring material is wound; a correction step in which curvature of the wiring material which has been drawn is corrected; and a cutting step in which the wiring material, which has been corrected, is cut to prescribed length to form an interconnector. The correction step includes a first step in which correction of curvature is carried out by making the wiring material come in contact with a first pulley that includes at a periphery thereof a first groove including: a first basal surface; and a pair of first inclined surfaces which are arranged on both sides of the first basal surface. In the first step, curvature in a width direction of the wiring material is corrected by making the wiring material come in contact with the first basal surface and not in contact with a peripheral end portion of the first inclined surface.

In accordance with the solar cell module manufacturing method and the manufacturing device according to embodiments of the present invention, it is possible to use wiring material drawn from a bobbin to fabricate an interconnector having reduced curvature. For this reason, it will be possible to reduce arrangement in which the interconnector protrudes beyond output electrodes of solar cell elements, and it will be possible to achieve reduction in width of output electrodes at solar cell elements. Accordingly, it will be possible to provide a solar cell module having high efficiency of electric power generation and having high reliability.

EMBODIMENTS FOR CARRYING OUT THE INVENTION

Solar Cell Module Constitution

Below, a solar cell module 1 which may be manufactured using a solar cell module manufacturing device 10 according to an embodiment of the present invention is described with reference to FIG. 1 through FIG. 3.

Figure 1:
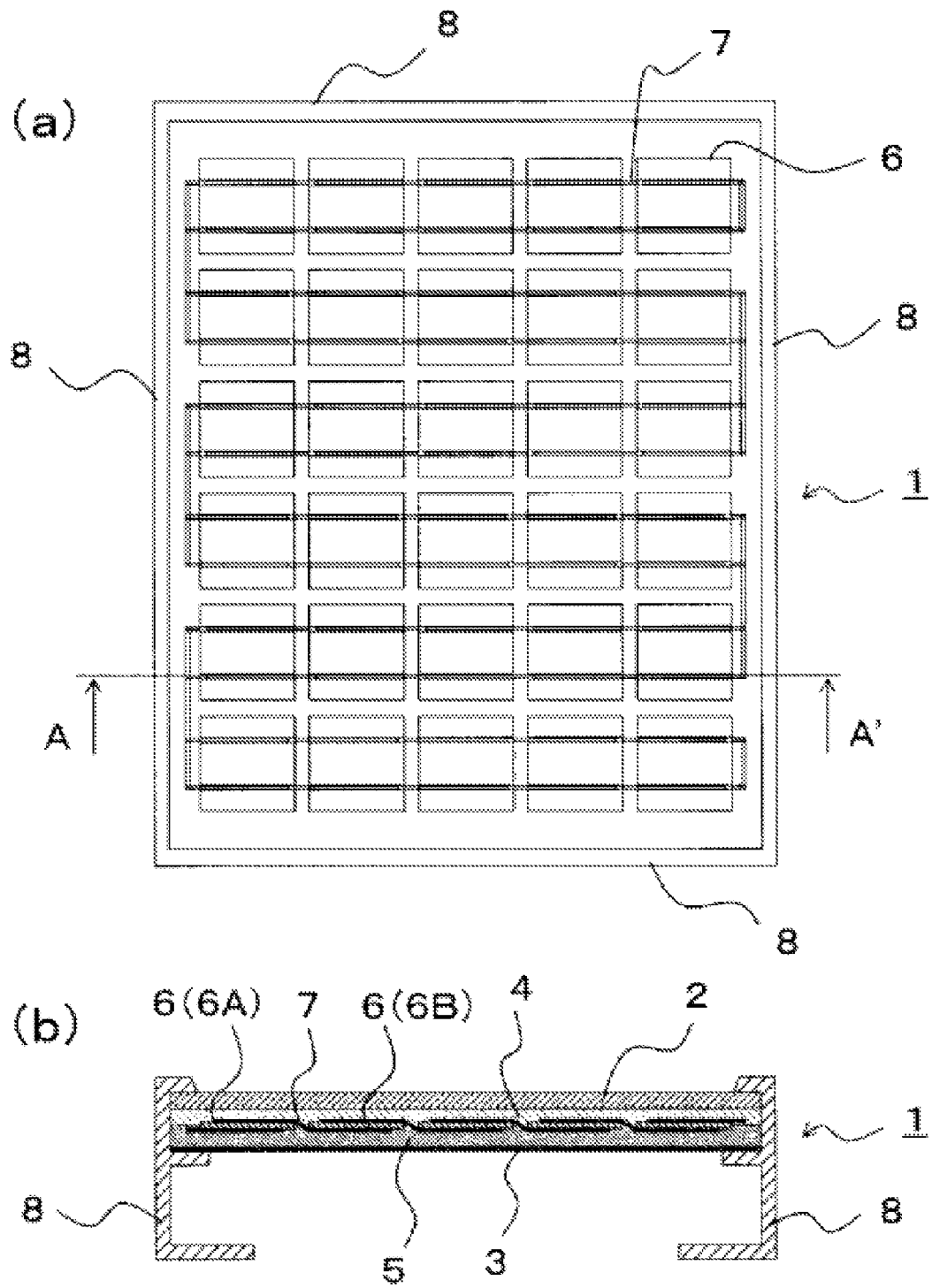
FIG. 1 is a drawing showing a solar cell module which may be manufactured using a solar cell module manufacturing device according to an embodiment of the present invention, (a) being a plan view as seen from the light-receiving side, and (b) a cross-sectional view showing section A-A' at FIG. 1(a).

As shown at FIG. 1 (b), a solar cell module 1 includes translucent substrate 2, back sheet 3, first filler material (light-receiving-side filler material) 4, second filler material (backside filler material) 5, plurality of solar cell elements (photoelectric converter elements) 6, interconnector 7, and frame 8. First filler material 4 and second filler material 5 are arranged between translucent substrate 2 and back sheet 3. Plurality of solar cell elements 6 are arranged between first filler material 4 and second filler material 5. Frame 8 is arranged peripherally with respect to solar cell module 1.

Figure 3:
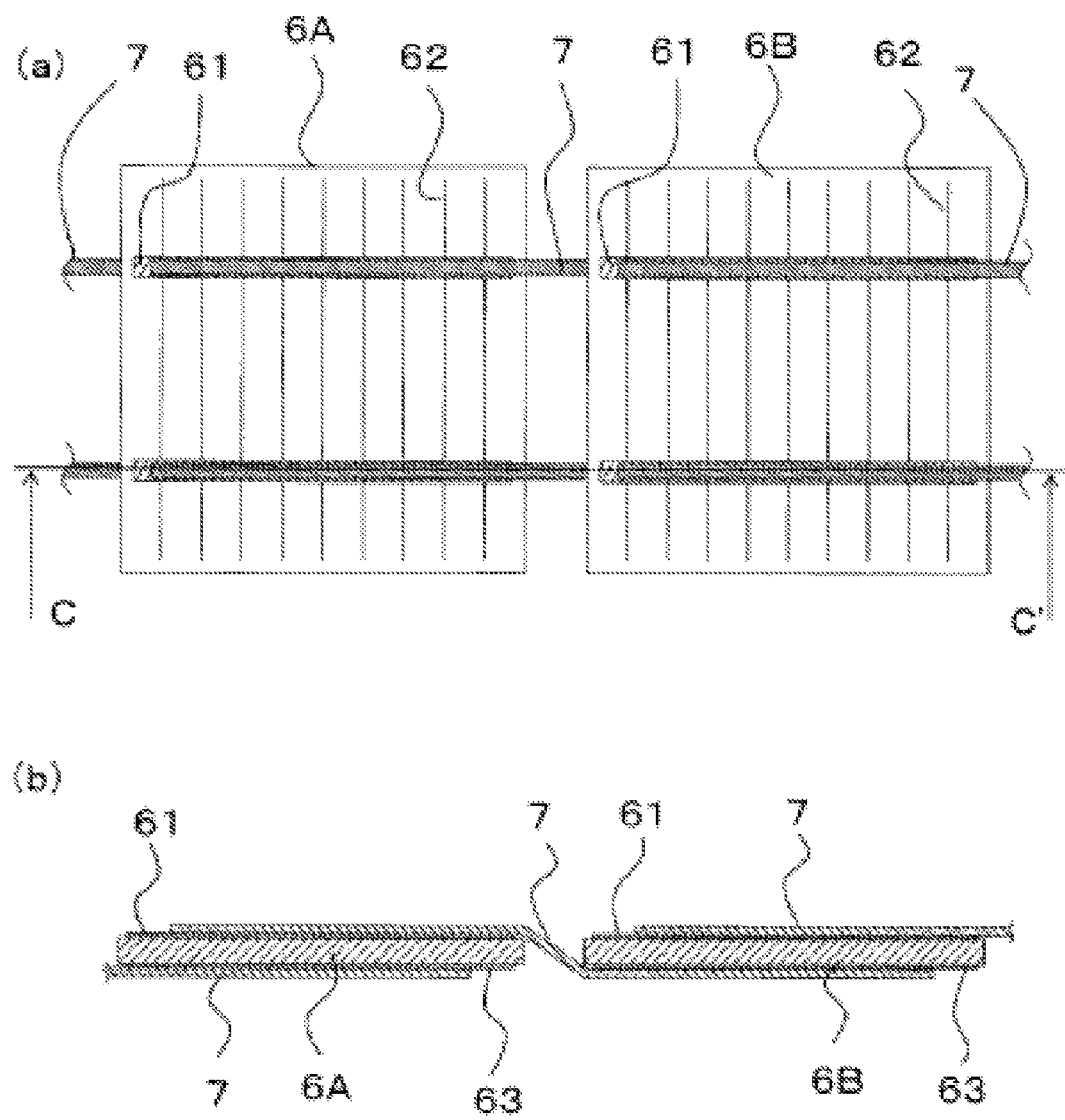
FIG. 3 is a drawing showing how an interconnector 7 is connected to light-receiving-side output electrodes and back-side output electrodes of solar cell elements of FIG. 2, (a) being a plan view as seen from the light-receiving side, and (b) being a cross-sectional view showing section C-C' at FIG. 3 (a).

Furthermore, as shown at FIG. 3 (a) and FIG. 3 (b), light-receiving-side output electrode 61 of one solar cell element 6 (first solar cell element 6A) and backside output electrode 63 of another solar cell element 6 (second solar cell element 6B) which is in a mutually neighboring relationship with the solar cell element 6 are electrically connected by interconnector 7.

Hereinafter, note that first solar cell element 6A and second solar cell element 6B will be used to denote mutually neighboring solar cell elements 6.

As translucent substrate 2, substrate including glass, polycarbonate resin, or the like may be employed. When glass plate is employed, super-white glass, tempered glass, heat-strengthened glass, solar reflective glass, or the like may be used, it being possible, for example, to use super-white glass of thickness on the order of 3 mm to 5 mm. On the other hand, when substrate including polycarbonate resin or other such synthetic resin the like is employed, thickness thereof may be on the order of 5 mm.

Figure 2:
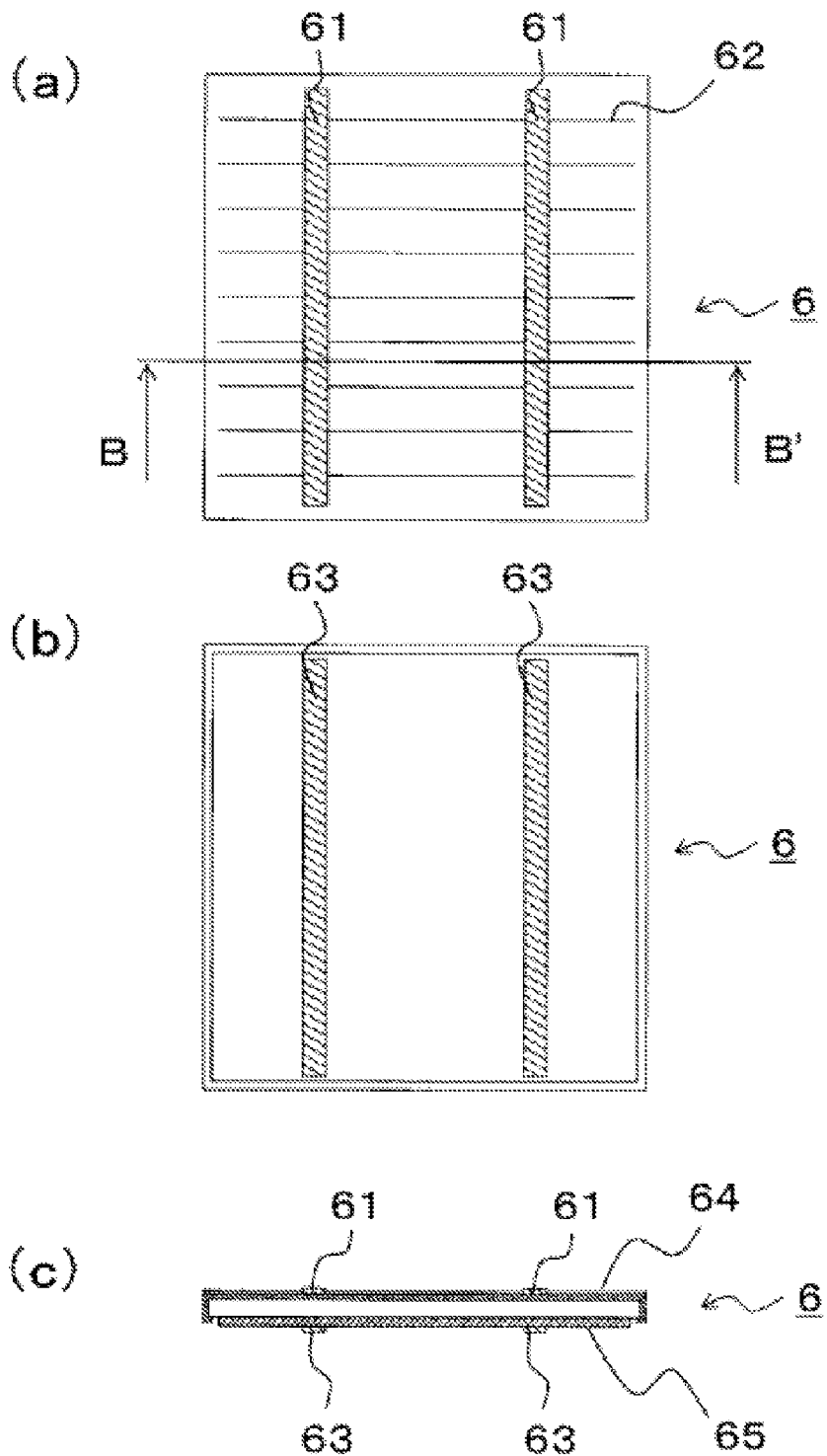
FIG. 2 is a drawing showing solar cell element used in the solar cell module of FIG. 1, (a) being a plan view as seen from the light-receiving side, (b) being a plan view as seen from the backside, and (c) being a cross-sectional view showing section B-B' at FIG. 2 (a).

As shown at FIG. 2 (c), solar cell element 6 includes light-receiving surface 64 and back surface 65. As shown at FIG. 2 (a), the light-receiving-surface 64 side of solar cell element 6 includes light-receiving-side output electrode 61 and includes finger electrode 62 which is connected to light-receiving-side output electrode 61. Furthermore, as shown at FIG. 2 (b), solar cell element 6 includes, at the back-surface 65 side thereof, backside output electrode 63.

More specifically, solar cell element 6 might, for example, be a plate-like body including monocrystalline silicon or polycrystalline silicon which is such that thickness thereof is on the order of 0.2 mm to 0.4 mm and size thereof is on the order of 150 mm to 160 mm, square. This solar cell element 6 includes at the interior thereof a PN junction at which a P layer containing an abundance of boron or other such P-type dopant and an N-type layer containing an abundance of phosphorous or other such N-type dopant come in mutual contact.

Finger electrode 62 has the function of gathering photogenerated carriers. There might be a multiplicity of finger electrodes 62 formed in parallel fashion with respect to a side of solar cell element 6 such that pitch therebetween is, for example, about 2 mm to 4 mm, and such that each thereof is, e.g., on the order of 0.1 mm to 0.2 mm in width. Finger electrodes 62 might, for example, be formed by screen printing of silver paste or other such electrically conductive paste.

Furthermore, light-receiving-side output electrode 61 has the function of collecting photocarriers gathered by finger electrodes 62 at light-receiving surface 64. Interconnector 7 is electrically connected and secured to the surface of light-receiving-side output electrode 61. There might be on the order of, e.g., two to four of such light-receiving-side output electrodes 61 formed so as to intersect finger electrode(s) 62 in perpendicular fashion, each of such light-receiving-side output electrodes 61 being on the order of, e.g., 1 mm to 3 mm in width. Light-receiving-side output electrode 61 might, for example, be formed by similar method as employed for finger electrode 62.

Backside output electrode 63, located at back surface 65 and corresponding to the aforementioned light-receiving-side output electrode 61, has the function of collecting photocarriers gathered at back surface 65. Backside output electrode 63 might, for example, be formed by screen printing of silver paste or other such electrically conductive paste.

A solar cell element 6 such as has been described above will be capable of generating electricity by receiving at solar cell element 6 sunlight passing through translucent substrate 2 and first filler material 4.

As shown at FIG. 3 (a) and FIG. 3 (b), interconnector 7 is such that one end thereof is electrically connected to light-receiving-side output electrode 61 of first solar cell element 6A, and the other end thereof is electrically connected to backside output electrode 63 of neighboring second solar cell element 6B. Such an interconnector 7 may be manufactured from a low-resistance wiring material 11 such as, for example, copper (oxygen-free copper), aluminum, or a cladded member containing Invar™ and copper by cutting this to prescribed length using solar cell module manufacturing device 10, described below. In the present embodiment, the surface of interconnector 7 is coated with solder.

Furthermore, as shown at FIG. 3 (a), the dimension (width) in the direction perpendicular to the long direction of interconnector 7 may be on the same order as the width of light-receiving-side output electrode 61 of solar cell element 6. Where this is the case, applying solder to interconnector 7 at a prescribed location toward the interior from the outer rim of light-receiving-side output electrode 61 will make it possible to achieve a large effective light-receiving surface area at solar cell element 6.

Furthermore, as shown at FIG. 3 (a) and FIG. 3 (b), the dimension (length) in the length direction of interconnector 7 is not less than the sum of the dimension (length) in the length direction of light-receiving-side output electrode 61 of solar cell element 6 and the dimension (length) in the length direction of backside output electrode 63 at the back surface of mutually neighboring solar cell element (second solar cell element 6B). By thus causing interconnector 7 to be arranged so as to overlap almost the entire region of light-receiving-side output electrode 61 of solar cell element 6, it is possible to reduce resistive component(s) of solar cell element 6. For example, if a solar cell element 6 including a plate-like body made of polycrystalline silicon which is on the order of approximately 150 mm, square, is employed, width of interconnector 7 might be on the order of 1 mm to 3 mm, thickness thereof might be on the order of 0.1 mm to 0.3 mm, and length thereof might be on the order of 140 mm to 300 mm.

Sheet-like members of thickness on the order of 0.4 mm to 1 mm including ethylene-vinyl acetate copolymer (hereinafter abbreviated as "EVA") and/or polyvinyl butyral (hereinafter abbreviated as "PVB") may, for example, be used at first filler material 4 and second filler material 5. The sheet members may be obtained by using a T die and extruder to form the aforementioned raw material into sheets. A laminator is used to carry out treatment by applying heat and pressure to cause these first filler material 4 and second filler material 5 to soften and fuse with other members of solar cell module 1 so as to form an integral structure.

Furthermore, a transparent material can be used for the EVA and/or PVB employed at second filler material 5 arranged at the backside. Furthermore, material having white or other such coloration due to presence of titanium oxide, pigment, or the like can be used for the EVA and/or PVB employed at second filler material 5 in such fashion as to match the surrounding environment in which solar cell module 1 is installed.

As back sheet 3, to prevent moisture from passing therethrough, weather-resistant fluorinated resin sheeting which sandwiches aluminum foil therebetween, polyethylene terephthalate (PET) sheeting on which alumina or silica has been vapor-deposited, or the like may, for example, be employed.

Frame 8, which protects the outer rim portion of solar cell module 1, may be manufactured from aluminum alloy by extrusion molding or the like.

Solar Cell Module Manufacturing Device

First Embodiment

Next, referring to FIG. 4 through FIG. 9, a solar cell module manufacturing device 10 according to a first embodiment of the present invention will be described.

Figure 4:
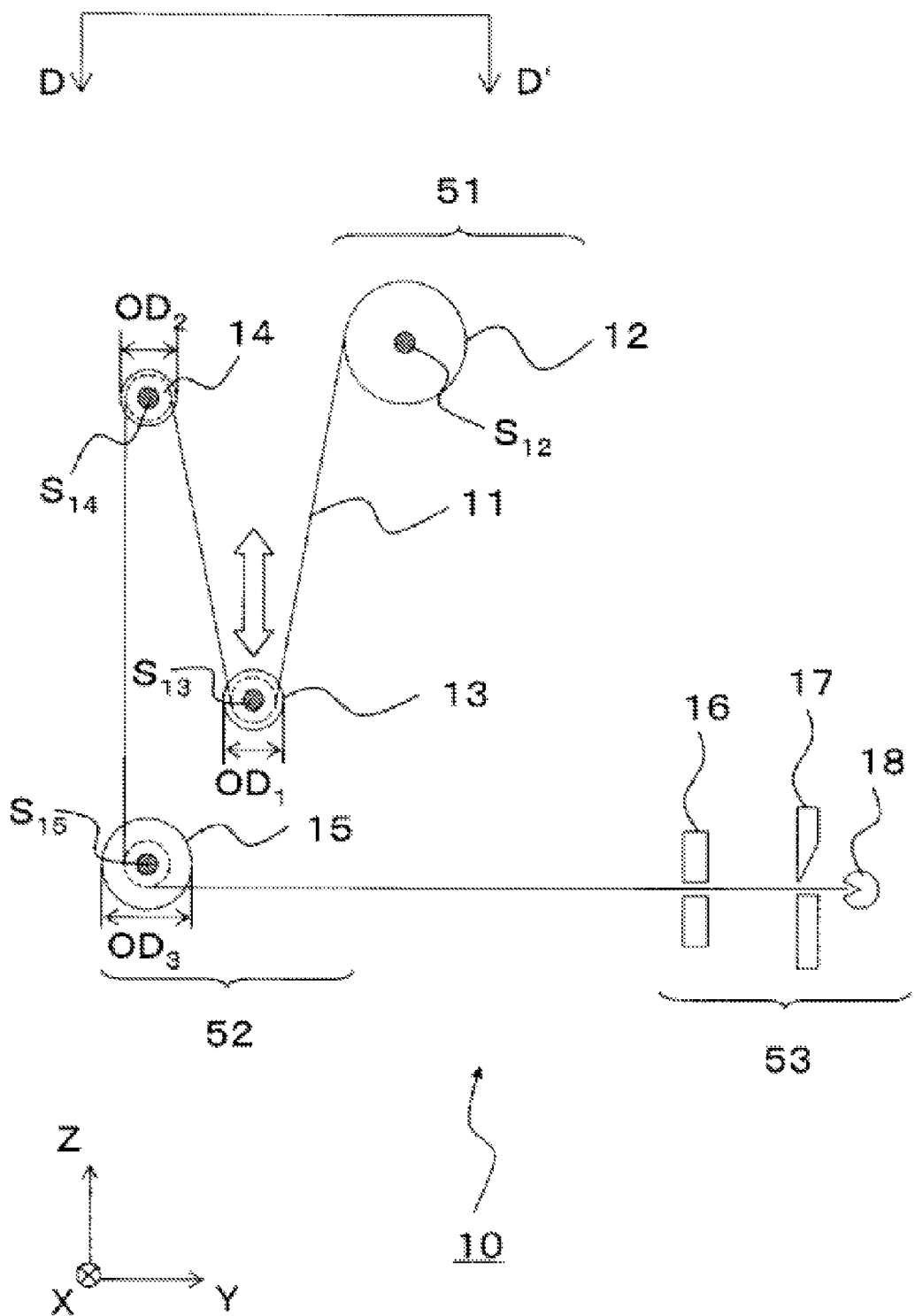
FIG. 4 is a side view showing a solar cell module manufacturing device according to a first embodiment of the present invention.

FIG. 4 specifically shows operations that take place at solar cell module manufacturing device 10 as wiring material 11 is drawn from bobbin 12 on which wiring material 11 is wound, and this is cut to appropriate length to form interconnector 7.

As shown in FIG. 4, solar cell module manufacturing device 10 includes supply portion 51, correction portion 52, and cutting portion 53. Supply portion 51 is where wiring material 11 is drawn from bobbin 12 on which wiring material 11 is wound. Correction portion 52 is where curvature of wiring material 11 that has been drawn from supply portion 51 is corrected. Cutting portion 53 is where wiring material 11 that has been subjected to correction at correction portion 52 is cut to prescribed length to form interconnector 7.

Steps carried out at these respective portions of solar cell module manufacturing device 10 up to where wiring material 11 is made into interconnector 7 are described in detail below.

Steps for forming interconnector 7 from wiring material 11 include a supply step, a correction step, and a cutting step. The respective steps are described below in the order in which they are carried out.

The supply step will first be described.

The supply step is carried out at supply portion 51. Supply portion 51 includes bobbin 12. During the supply step, wiring material 11 is supplied by drawing one prescribed length thereof at a time from bobbin 12. Here, bobbin 12 might, for example, include resin and be cylindrical such that diameter thereof is 5 cm to 15 cm and height thereof is 10 cm to 30 cm. Wiring material 11 is wound in continuous fashion on bobbin 12 such that, in terms of mass, there is on the order of 5 kg to 10 kg of this wound thereon. Note that wiring material 11 is a strip-like electrically conductive material, which may, for example as has been mentioned above, be copper foil, the surface of which has been coated with solder, and which is 1 mm to 3 mm in width, and which is 0.1 mm to 0.4 mm in thickness.

Wiring material 11 wound on bobbin 12 is such that, when first drawn from bobbin 12, it is in a state such that it exhibits spiral-like curl which has been imparted thereto as a result of winding and in which both in-plane bending and out-of-plane bending combine in complex fashion.

In the present embodiment, a central axis $S_{12}$ of bobbin 12 is hollow, a rotational shaft being fitted within the central axis $S_{12}$ of bobbin 12. In addition, a timer or the like causes bobbin 12 to rotate by an amount corresponding to the length of interconnector 7 with each passage of a prescribed interval of time. Cooperation of this rotation of bobbin 12 with action by which a prescribed length of wiring material 11 is repeatedly pulled by pulling means 18, described below, causes wiring material 11 to be drawn from bobbin 12 and to be delivered downstream therefrom. At such time, the time of rotation of bobbin 12 and the distance over which pulling is carried out by pulling means 18 should be chosen as appropriate in correspondence to the length of the interconnector 7 that is to be formed.

The correction step will next be described.

The correction step is carried out at correction portion 52. As shown in FIG. 4, wiring material 11 drawn from bobbin 12 is delivered to correction portion 52. Correction portion 52 includes first pulley 13, second pulley 14, and third pulley 15.

Figure 6:
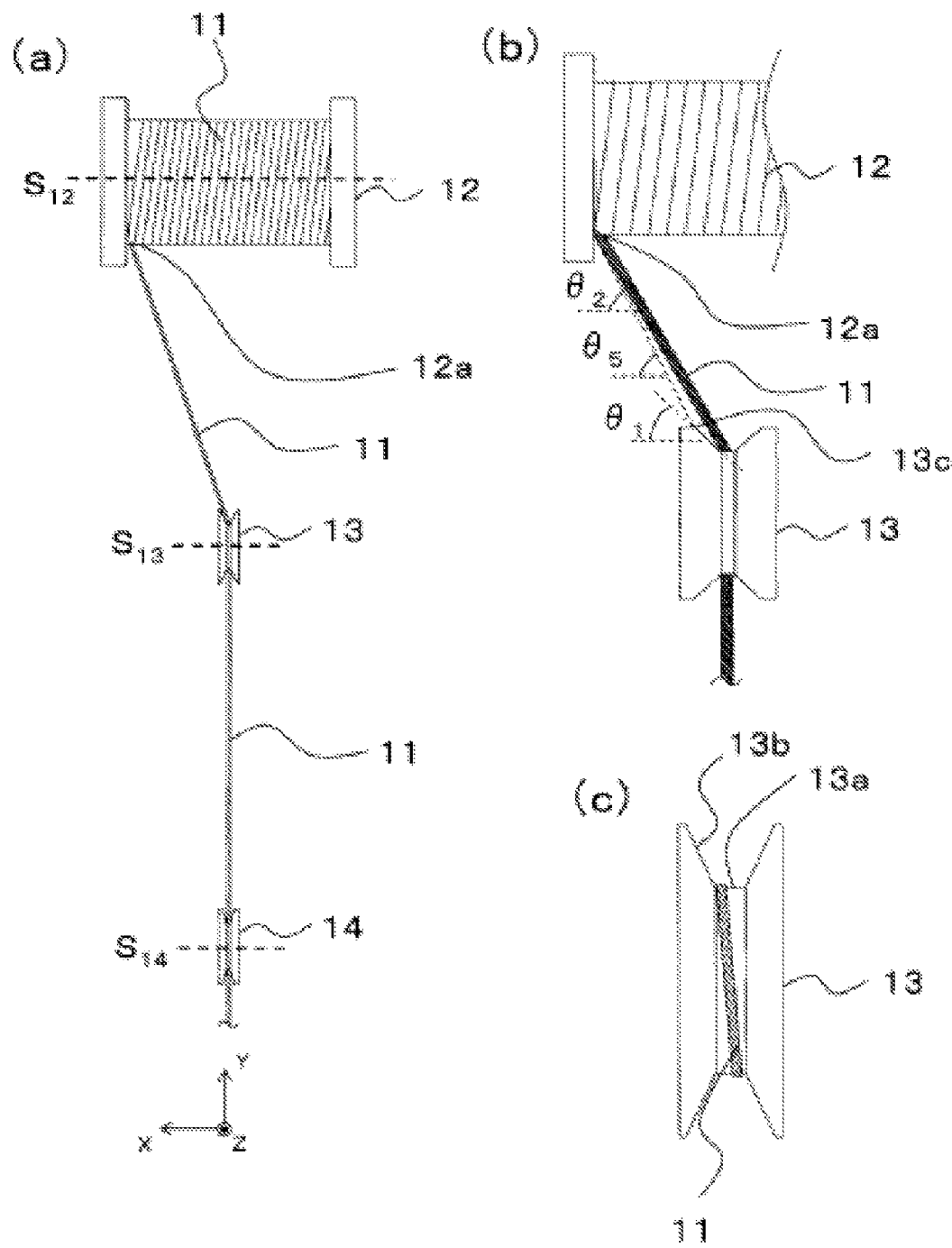
FIG. 6 is a drawing showing the situation at wiring material in the correction portion of FIG. 4, (a) being a plan view as seen from the D-D' direction in FIG. 4, (b) being a partial enlarged plan view showing the situation at wiring material as it travels past the first pulley, and (c) being an even more enlarged partial plan view showing the situation at wiring material as it travels past the first pulley.

As shown in FIG. 4, in the present embodiment, first pulley 13 is arranged so as to be below both bobbin 12 and second pulley 14 in the vertical direction (the Z direction in the drawing). In addition, second pulley 14 is arranged so as to be below bobbin 12 in the vertical direction. Furthermore, as shown in FIG. 4 and FIG. 6, central axis S13 of first pulley 13, central axis S14 of second pulley 14, and central axis S15 of third pulley 15 are each arranged so as to be more or less parallel to central axis S12 of bobbin 12.

At correction portion 52, wiring material 11 drawn from bobbin 12 travels, in order, from first pulley 13 to second pulley 14 to third pulley 15. That is, the correction step includes a first step in which wiring material 11 travels past first pulley 13, a second step in which wiring material 11 travels past second pulley 14, and a third step in which wiring material 11 travels past third pulley 15.

The first step will first be described.

As shown in FIG. 4, first pulley 13 is arranged so as to be the upstream-most pulley of the three pulleys, being arranged such that wiring material 11 drawn from bobbin 12 comes in contact therewith. That is, it is a pulley that comes in contact with wiring material 11 drawn from bobbin 12.

In the present specification, with respect to the path traveled by wiring material 11, note that the supply portion 51 side thereof is referred to as upstream, and the cutting portion 53 side thereof is referred to as downstream.

Figure 5:
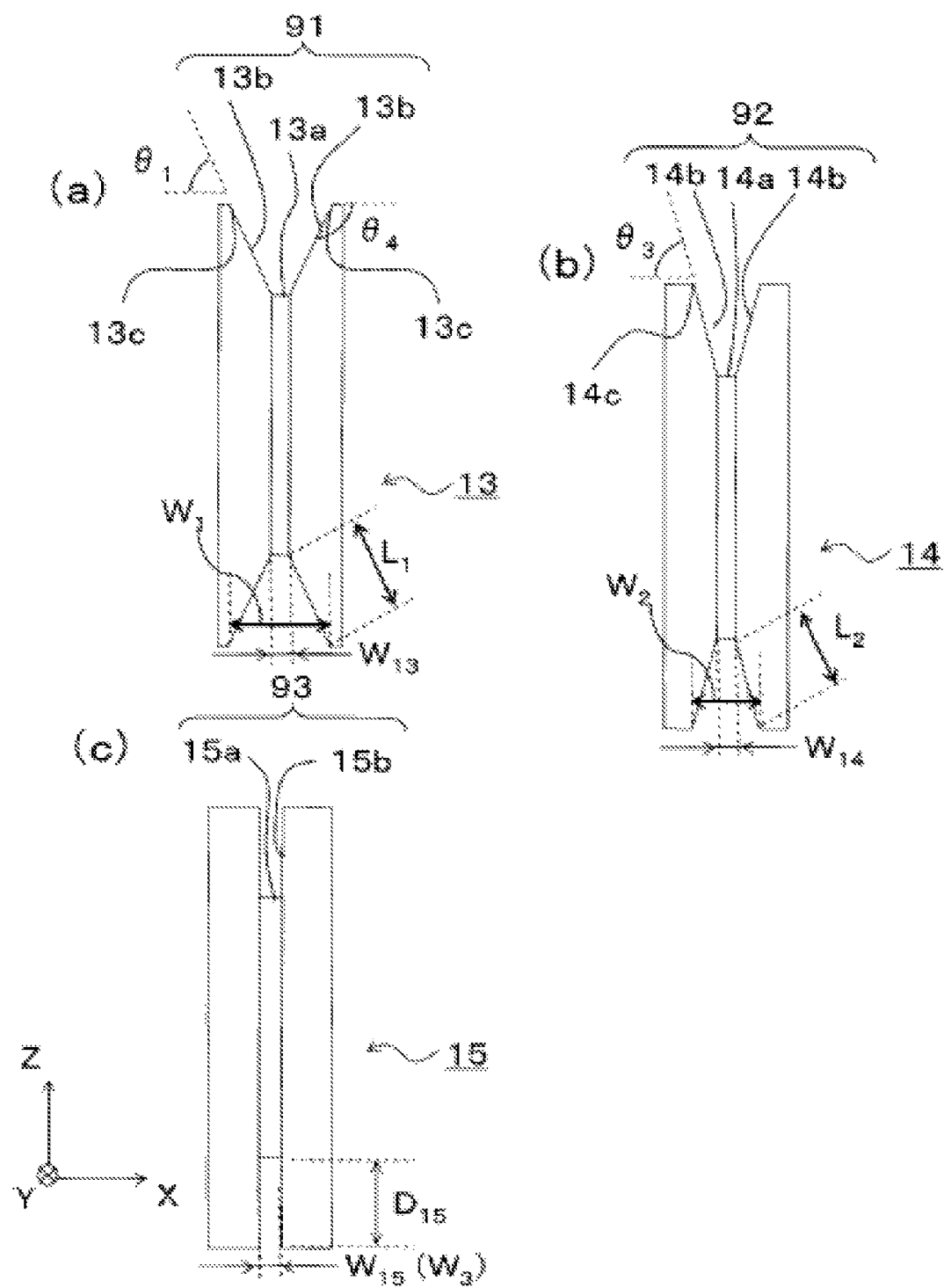
FIG. 5 is a drawing showing the correction portion at the solar cell module manufacturing device of FIG. 4, (a) being a plan view of a first pulley, (b) being a plan view of a second pulley, and (c) being a plan view of a third pulley.

More specifically, as shown at FIG. 5 (a), first pulley 13 is a disk-shaped pulley including a first groove 91 at the periphery thereof. First groove 91 includes a first basal surface 13a and a pair of first inclined surfaces 13b arranged to either side of the first basal surface 13a. First basal surface 13a is a surface that comes in contact with wiring material 11.

As a result of adoption of such constitution, because first groove 91 of first pulley 13 is of trapezoidal cross-section, wiring material 11 drawn from bobbin 12 is made to sink down onto and rest against first basal surface 13a of first pulley 13, and is wound about and along the first basal surface 13a. In addition, when developed, this first basal surface 13a would be more or less in the shape of a rectangle, the long side of which is in a direction perpendicular to the axis of first pulley 13. Due to this fact, because wiring material 11 is stretched out in linear fashion by first pulley 13, it is possible to smoothly correct bending in the in-plane direction.

Furthermore, as shown in FIG. 4, first pulley 13 is capable of moving in the vertical direction (the Z direction). That is, first pulley 13 is a movable pulley which is capable of moving in the Z direction relative to bobbin 12 which is stationary in the vertical direction (the Z direction). As a result, every time that wiring material 11 is drawn from bobbin 12, first pulley 13 is lifted up by the tension of wiring material 11 and is made to move upward (i.e., in the +Z direction) relative to the situation shown in FIG. 4. As a result of employment of such mechanism, tension occurring when wiring material 11 is drawn from bobbin 12 is converted into upward motion of first pulley 13. As a result, it is possible to reduce the tendency for first pulley 13 to rotate due to inertia, and it is also possible to cause constant tension to be maintained at wiring material 11. By causing the tension which is applied to wiring material 11 to be made constant in this manner, a constant out-of-plane bending can be applied which is in a direction that is opposite to the curl imparted to wiring material 11 as a result of winding, making it possible to reverse the bending of wiring material 11. Note that by causing this tension to be a force that is within the range of elasticity of wiring material 11, it is possible to reduce occurrence of work hardening of wiring material 11.

Furthermore, as shown at FIG. 6 (b), the angle by which first inclined surface 13b of first groove 91 is inclined relative to first basal surface 13a is taken to be inclination angle θ1. The angle by which wiring material 11 drawn from supply portion 51, i.e., bobbin 12, is inclined relative to first basal surface 13a is taken to be inclination angle θ2. At such time, inclination angle θ1 is less than or equal to inclination angle θ2. This makes it possible, when wiring material 11 is drawn from end portion 12a of bobbin 12, to reduce folding thereof by first peripheral end portion 13c of first pulley 13 due to interference between wiring material 11 and first peripheral end portion 13c. As a result, it is possible to reduce curvature of wiring material 11 in the in-plane direction.

Also, as shown at FIG. 5 (a), in the present embodiment, inclination angle θ4 of first inclined surface 13b relative to the outside circumferential surface of first pulley 13 is an obtuse angle. As a result of adoption of such constitution, it is possible to reduce the tendency for folding by first peripheral end portion 13c to occur even when wiring material 11 drawn from bobbin 12 interferes with first pulley 13.

Moreover, as shown at FIG. 6 (b), the angle by which a line connecting end portion 12a of bobbin 12 and first peripheral end portion 13c of first inclined surface 13b of first groove 91 is inclined relative to first basal surface 13a is taken to be inclination angle $\theta_5$. At such time, inclination angle $\theta_1$ is less than inclination angle $\theta_5$.

Note that inclination angle $\theta_1$ of first inclined surface 13b may be set so as to be within a range that permits reduction in meandering of wiring material 11 and that permits reduction in twisting of wiring material 11. For example, when distance L1 between bobbin 12 and first pulley 13 is 500 mm, and the length of the surface about which wiring material 11 is wound on bobbin 12 is 300 mm, inclination angle $\theta_1$ of first inclined surface 13b may be set so as to be less than or equal to 73°. Furthermore, from the standpoint of satisfactorily causing wiring material 11 to sink down onto and rest against first basal surface 13a of first pulley 13, inclination angle $\theta_1$ of first inclined surface 13b may be set so as to be greater than or equal to 50°.

Furthermore, as described above, movement of first pulley 13 in the vertical direction and application of constant tension to wiring material 11 causes wiring material 11 to sink down onto and rest against first basal surface 13a of first pulley 13, as a result of which it is possible to correct in-plane bending of wiring material 11.

First basal surface 13a of first pulley 13 may be 1.1 to 1.3 times the width of wiring material 11. As a result, as shown at FIG. 6 (c), wiring material 11 can be made to traverse first basal surface 13a of first groove 91 at a shallow angle. This makes it possible to reduce the tendency for an abrupt in-plane bending force to be applied to the wiring material 11 which is delivered to first pulley 13, and makes it possible to reduce the tendency for excessive folding to occur.

Note that first pulley 13 may adjust the tension which is applied to wiring material 11 by any of a variety of means. For example, the mass of first pulley 13 might be made as small as possible, and the portion thereof which contacts wiring material 11 might be polished to a mirror finish. That is, the mass of first pulley 13 might be made as small as possible, and first basal surface 13a might be made to have a mirror finish. In such case, by using a linear slider or the like to cause the motion of first pulley 13 in the vertical direction to be as smooth as possible, it will be possible to adjust the tension which is applied to wiring material 11. Furthermore, it is possible to adjust the tension which is applied to wiring material 11 by driving first pulley 13 with an air cylinder, servo motor, or the like.

The second step will next be described.

As shown in FIG. 4, second pulley 14 is arranged so as to be downstream from first pulley 13. In addition, wiring material 11 which has been subjected to correction by first pulley 13 comes in contact with second pulley 14.

As shown at FIG. 5 (b), second pulley 14 is a disk-shaped pulley including a second groove 92 at the periphery thereof. Second groove 92 includes a second basal surface 14a and a pair of second inclined surfaces 14b arranged to either side of the second basal surface 14a. Second basal surface 14a is a surface that comes in contact with wiring material 11.

As a result of adoption of such constitution, due to the fact that second groove 92 is of trapezoidal cross-section, wiring material 11 which has traveled past first pulley 13 is made to sink down onto and rest against second basal surface 14a of second pulley 14, and is wound about and along the second basal surface 14a. As a result, it is possible to reduce the tendency for wiring material 11 to interfere with second peripheral end portion 14c of second inclined surface 14b, and it is possible to reduce folding of wiring material 11 in the in-plane direction.

Furthermore, unlike first pulley 13 which is movable in the vertical direction as has been described above, the location of second pulley 14 relative to bobbin 12 is stationary. That is, whereas first pulley 13 is a movable pulley, second pulley 14 is a fixed pulley. This fact makes it possible for wiring material 11 to assume a state whereby it is pulled in linear fashion between first pulley 13 and second pulley 14, and makes it possible for second pulley 14 to, in cooperation with first pulley 13, apply a constant tension to wiring material 11.

As a result, it is also possible when wiring material 11 travels past second pulley 14 to cause in-plane and out-of-plane curl imparted to wiring material 11 as a result of winding to be corrected. This being the case, even where the curl imparted to wiring material 11 as a result of winding is incapable of being adequately corrected at first pulley 13 and remains uncorrected as wiring material 11 travels past first pulley 13 such that it is incident on second pulley 14 in inclined fashion, it will be possible to cause satisfactory correction of wiring material 11.

Furthermore, as shown at FIG. 5 (b), the angle by which second inclined surface 14b is inclined relative to second basal surface 14a is taken to be inclination angle $\theta_3$. At such time, inclination angle $\theta_3$ may be greater than the aforementioned inclination angle $\theta_1$. In such case, wiring material 11, the in-plane bending of which in the X direction has been corrected in rough fashion at first pulley 13, will be made to travel past second pulley 14, which includes second inclined surface 14b having larger inclination angle. This makes it possible to carry out precise correction of curvature of wiring material 11 in the X direction at second pulley 14.

Inclination angle $\theta_3$ of second inclined surface 14b might be set so as to be an angle which is greater than inclination angle $\theta_1$ by, for example, 10° or more. More specifically, in a case, as described above, in which inclination angle $\theta_1$ of first inclined surface 13b of first pulley 13 is 73°, inclination angle $\theta_3$ of second inclined surface 14b of second pulley 14 might be set so as to be, for example, 85°.

Moreover, as shown at FIG. 5 (a) and FIG. 5 (b), width $W_{14}$ of second basal surface 14a may be more or less equal to width $W_{13}$ of first basal surface 13a. This will make it possible to cause wiring material 11 which was subjected to correction of curvature in traveling past first pulley 13 to be subjected to further correction, and will make it possible to stabilize the feed direction of wiring material 11.

Also, as shown at FIG. 5 (a), as viewed from a direction perpendicular to the axis of first pulley 13, width W1 of first groove 91 is taken to be the maximum distance between the pair of first inclined surfaces 13b in a direction (X direction) parallel to the axis of first pulley 13. Similarly, as shown at FIG. 5 (b), as viewed from a direction perpendicular to the axis of second pulley 14, width W2 of second groove 92 is taken to be the maximum distance between the pair of second inclined surfaces 14b in a direction (X direction) parallel to the axis of second pulley 14. At such time, width W2 of second groove 92 may be smaller than width W1 of first groove 91. As a result of adoption of such constitution, it is possible to cause wiring material 11, which has large deflection immediately after it has been drawn from bobbin 12, to be guided to first pulley 13, which includes larger opening width W1, without causing production of excessive curvature.

For example, width $W_1$ of first groove 91 may be set so as to be approximately 10 mm, and width $W_2$ of second groove 92 may be set so as to be approximately 6 mm.

As shown in FIG. 4, note that, in the present embodiment, outside diameter OD1 of first pulley 13 and outside diameter OD2 of second pulley 14 are more or less mutually equal. As a result of adoption of such constitution, because the first inclined surface 13b and the second inclined surface 14b have a magnitude relation of inclination angles as described above, length L1 of first inclined surface 13b will be greater than length L2 of second inclined surface 14b.

The third step will next be described.

As shown in FIG. 4, third pulley 15 is arranged so as to be downstream from second pulley 14 and so as to be upstream from cutting portion 53. In addition, wiring material 11 which was subjected to correction of curvature in traveling past first pulley 13 and second pulley 14 comes in contact with third pulley 15.

As shown at FIG. 5 (c), third pulley 15 is a disk-shaped pulley including a third groove 93 at the periphery thereof. Third groove 93 includes a third basal surface 15a and a pair of wall surfaces 15b arranged to either side of the third basal surface 15a. Wall surfaces 15b are arranged so as to be more or less perpendicular to third basal surface 15a. Third basal surface 15a is a surface that comes in contact with wiring material 11.

As a result of adoption of such constitution, because third groove 93 is of rectangular cross-section, wiring material 11 which has traveled past second pulley 14 is guided by wall surfaces 15b, and is wound about and along third basal surface 15a.

This third pulley 15 redirects wiring material 11 so as to cause wiring material 11 to be delivered to cutting portion 53. That is, third pulley 15 has the function of adjusting the feed direction of wiring material 11 which was subjected to correction at first pulley 13 and second pulley 14.

More specifically, wiring material 11 is repeatedly and intermittently pulled by pulling means 18, described below. For this reason, the value of the tension of wiring material 11 fluctuates greatly in accompaniment to the action of pulling means 18. In the present embodiment, third pulley 15 therefore includes a rectangular third groove 93 at the periphery thereof. Due to this fact, it is possible for these wall surfaces 15b to adjust direction of the wiring material 11 which has been subjected to correction of curvature. This being the case, it is possible to reduce the tendency for the feed direction of wiring material 11 to become misaligned when the tension of wiring material 11 relaxes in accompaniment to the action of pulling means 18.

At such time, as shown at FIG. 5 (c), the depth $D_{15}$ of third groove 93 may be set so as to be, for example, greater than or equal to 10 mm. That is, the length in the radial direction of wall surface 15b of third groove 93 may be set so as to be greater than or equal to 10 mm. As a result, it will be possible prevent wiring material 11 from slipping out of third groove 93 of third pulley 15 when the tension acting on wiring material 11 is relaxed.

Furthermore, width $W_{15}$ of third basal surface 15a may be more or less equal to width $W_{14}$ of second basal surface 14a. This increases the effect whereby the tendency for the feed direction of wiring material 11 to become misaligned is reduced. Note in the present embodiment that because width $W_{13}$ of first basal surface 13a and width $W_{14}$ of second basal surface 14a are more or less mutually equal as has been described above, this means that width $W_{13}$ of first basal surface 13a, width $W_{14}$ of second basal surface 14a, and width $W_{15}$ of third basal surface 15a will be more or less mutually equal.

Note, as shown at FIG. 5 (c), that as viewed from a direction perpendicular to the axis of third pulley 15, width $W_3$ of third groove 93 is taken to be the maximum distance between the pair of wall surfaces 15b in a direction (X direction) parallel to the axis of third pulley 15. At such time, width $W_3$ of third groove 93 may be smaller than width $W_2$ of second groove 92. As a result of adoption of such constitution, it is possible to reduce the tendency for the tension acting on wiring material 11 to become relaxed due to clearance between third pulley 15 and wiring material 11, deflection of which was corrected at first pulley 13 and second pulley 14. As a result, it is possible to reduce the tendency for further deflection to be produced at wiring material 11, which might be the case were this relaxation of tension allowed to cause wiring material 11 to run rampant within third groove 93 of third pulley 15. Note in the present embodiment that, as has been described above, the pair of wall surfaces 15b are respectively more or less perpendicular to third basal surface 15a. This being the case, width $W_3$ of third groove 93 and width $W_{15}$ of third basal surface 15a are more or less mutually equal.

Also, in the present embodiment, width $W_2$ of second groove 92 is less than width $W_1$ of first groove 91 but is greater than width $W_3$ of third groove 93. As a result of adoption of such constitution, because clearances between wiring material 11 and respective grooves at the correction step become progressively smaller, it is possible for wiring material 11, deflection of which has been corrected, to be delivered to the cutting step without causing production of excessive new deflection therein.

Note in the present embodiment that whereas outside diameter OD1 of first pulley 13 and outside diameter OD2 of second pulley 14 are more or less mutually identical as has been described above, outside diameter OD3 of third pulley 15 is greater than outside diameter OD1 and outside diameter OD2. As a result of adoption of such constitution, it is possible to correct deflection of wiring material 11 in the out-of-plane direction.

Such first pulley 13, second pulley 14, and third pulley 15 may, for example, be manufactured from stainless steel, aluminum alloy, or the like.

The cutting step will lastly be described.

Figure 7:
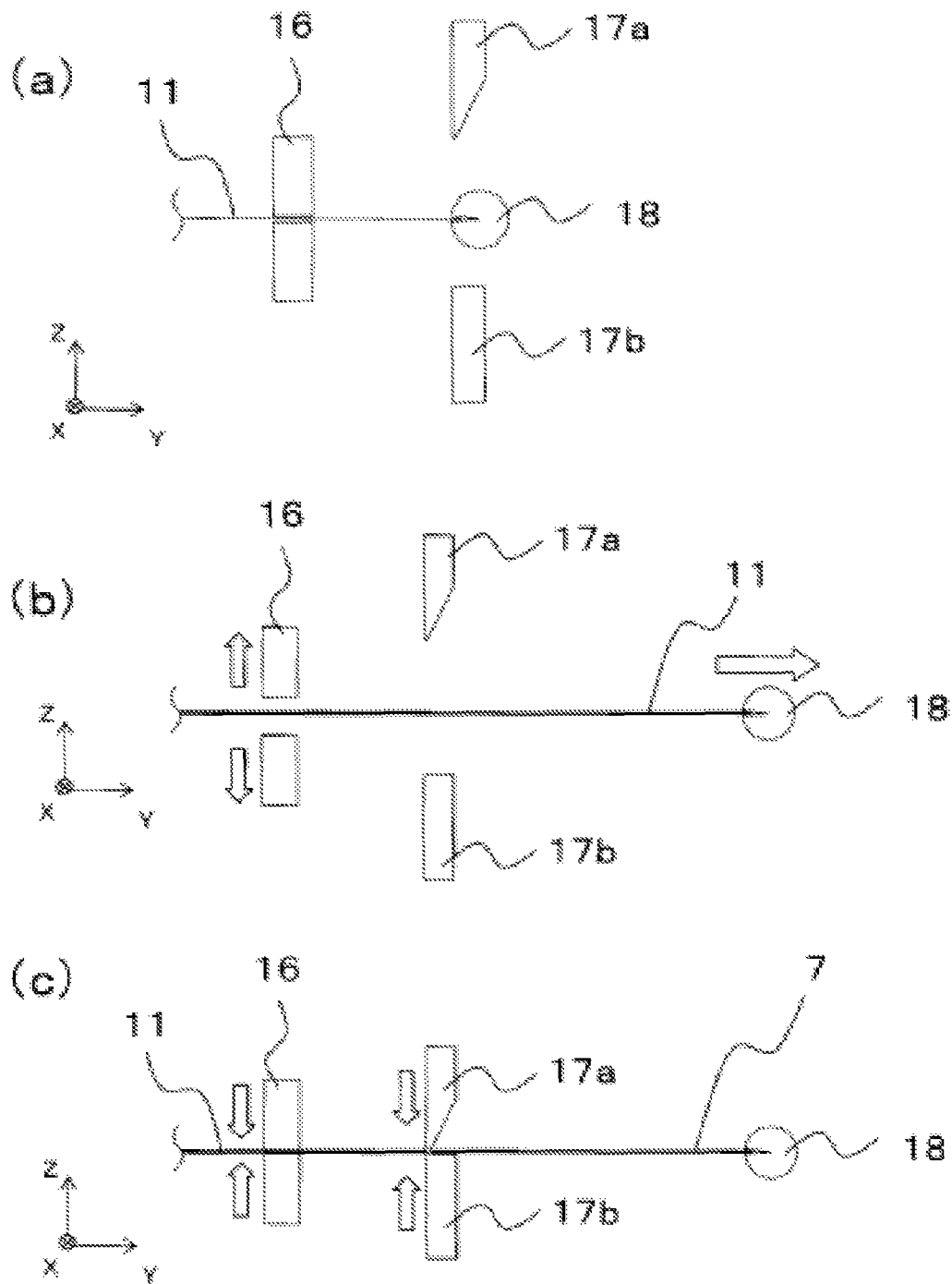
FIG. 7 is a side view showing an enlarged view of the cutting portion at the solar cell module manufacturing device of FIG. 4.

The cutting step is carried out at cutting portion 53. More specifically, as shown in FIG. 4 and FIG. 7, cutting portion 53 includes immobilizing means 16, cutting means 17, and pulling means 18, these means being employed to carry out the cutting step.

Immobilizing means 16, which is securely fastened to the main body portion of solar cell module manufacturing device 10, clamps wiring material 11 therebetween and renders it stationary.

Cutting means 17, which includes cutter 17a and cutting die 17b, cuts wiring material 11.

Pulling means 18, which is capable of being driven by a motor or the like, grabs wiring material 11 and draws it in the drawing direction (+Y direction).

Operations taking place at the various components in the cutting step will be described with reference to FIG. 7.

First, as shown at FIG. 7 (a), wiring material 11 which has traveled past third pulley 15 is rendered stationary by immobilizing means 16. Next, as shown at FIG. 7 (b), the end portion of wiring material 11 is grasped by pulling means 18, immobilizing means 16 is opened, and pulling means 18 is made to move in the drawing direction (+Y direction). At such time, pulling means 18 is made to move in the drawing direction in such fashion as to cause the length which is drawn from cutting means 17 to be the length of interconnector 7. In other words, it will be the case that the length from cutting means 17 to pulling means 18 is the length of interconnector 7. Next, as shown at FIG. 7 (c), wiring material 11 is made to assume a stationary state as it is again pulled between immobilizing means 16 and pulling means 18, at which time wiring material 11 is cut by cutting means 17 to form interconnector 7. By repeatedly carrying out such series of operations, it is possible to sequentially form interconnectors 7.

Interconnectors 7 formed by the foregoing method make it possible to reduce folding and/or meandering in the in-plane direction during manufacture.

Figure 8:
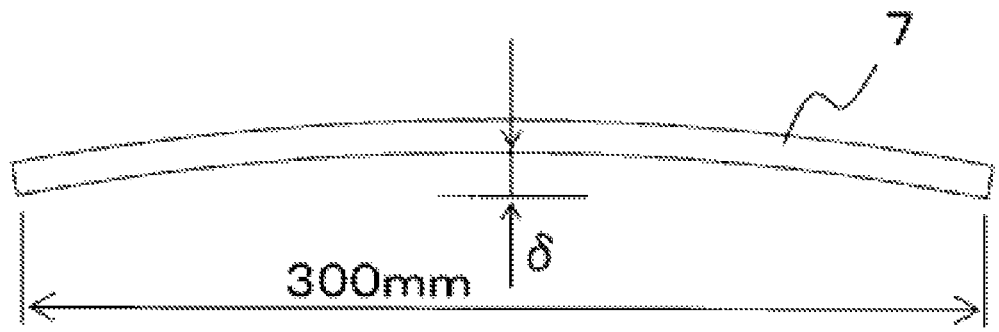
FIG. 8 is a drawing illustrating measurement of deflection of an interconnector formed using the solar cell module manufacturing device of FIG. 4.

FIG. 8 shows examples of a cross-sectional profile in the length direction of interconnector 7 that may be obtained using a solar cell module manufacturing device 10 according to a first embodiment of the present invention. In addition, TABLE 1 shows results of measurement of deflection of interconnector 7 in the in-plane direction in a situation in which this solar cell module manufacturing device 10 according to the first embodiment is employed versus the situation in a comparative example in which a solar cell module manufacturing device which does not make use of the present invention is employed. What is referred to here as a comparative example of a solar cell module manufacturing device is one in which the first pulley 13 and the second pulley 14 in solar cell module manufacturing device 10 shown in FIG. 4 have respectively been replaced with pulleys including grooves which have rectangular cross-sections.

Moreover, results; more specifically, deflection δ of interconnector 7 in the in-plane direction when the dimension in the length direction of interconnector 7 was 300 mm as shown in FIG. 8 are shown at TABLE 1.

TABLE 1

| | Deflection δ [mm] Over 300 mm | |
|---|---|---|
| Sample No. | Comparative Example | First Embodiment |
| No. 1 | 4.51 mm | ≤0.1 mm |
| No. 2 | 4.02 mm | ≤0.1 mm |
| No. 3 | 3.74 mm | ≤0.1 mm |
| No. 4 | 3.51 mm | ≤0.1 mm |
| No. 5 | 2.17 mm | ≤0.1 mm |
| No. 6 | 2.34 mm | ≤0.1 mm |
| No. 7 | 3.25 mm | ≤0.1 mm |
| No. 8 | 2.11 mm | ≤0.1 mm |
| No. 9 | 3.61 mm | ≤0.1 mm |
| No. 10 | 1.95 mm | ≤0.1 mm |
| Average | 3.12 mm | ≤0.1 mm |

As shown at TABLE 1, when a solar cell module manufacturing device 10 according to a first embodiment was used, it was possible to reduce the amount of deflection δ of interconnector 7 in the in-plane direction to 0.1 mm or less. On the other hand, in the comparative example, the average value of the deflection δ of interconnector 7 in the in-plane direction was 3 mm or more.

Method for Manufacturing Solar Cell Module 1

Methods for manufacturing solar cell modules 1 using interconnectors 7 formed in accordance with the foregoing methods will next be described.

Solder may be used to connect interconnector 7 obtained as described above to light-receiving-side output electrode 61 and/or backside output electrode 63 of solar cell element 6.

Figure 9:
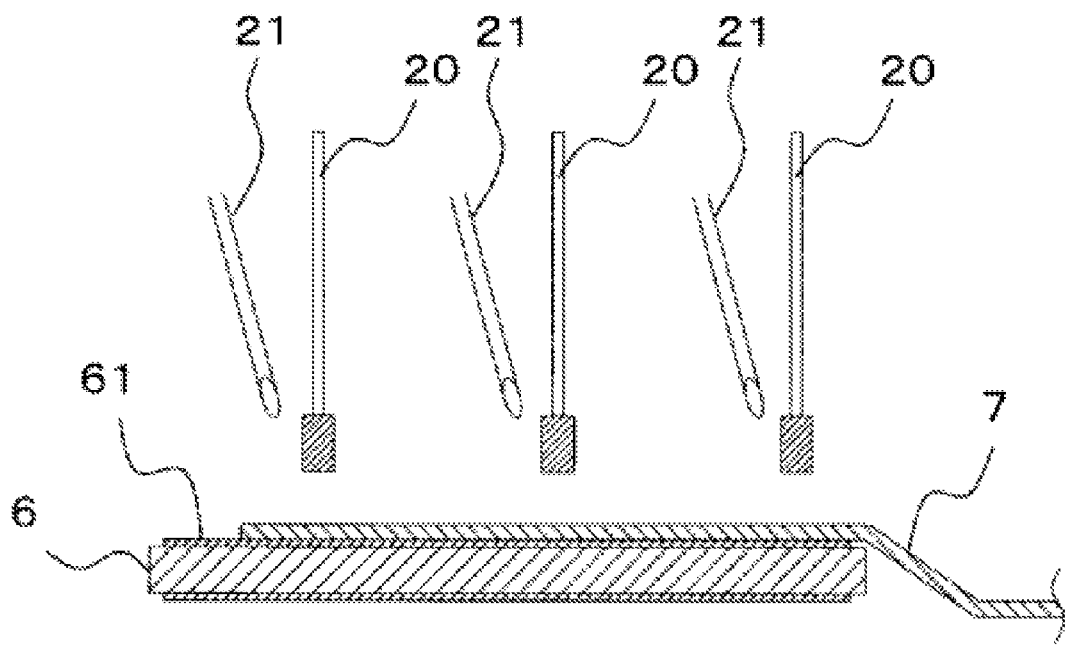
FIG. 9 is a side view showing a device for soldering an interconnector to a solar cell element.

FIG. 9 shows an example of how interconnector 7 might be soldered to solar cell element 6. Attachment of interconnector 7 to light-receiving-side output electrode 61 of solar cell element 6 might, for example, be carried out in accordance with the following method.

First, interconnector 7 is arranged above light-receiving-side output electrode 61 of solar cell element 6. Retaining clamps 20 are thereafter lowered, and interconnector 7 is pressed against light-receiving-side output electrode 61 by the retaining clamps 20. At such time, over a period lasting several seconds, nozzles 21 blow air which has been heated to on the order of 400° C. to 500° C. toward locations where interconnector 7 is pressed against light-receiving-side output electrode 61 by the foregoing retaining clamps 20. This causes solder at the surface of interconnector 7 to melt, and interconnector 7 to be joined to light-receiving-side output electrode 61. Thereafter, when the solder has hardened, retaining clamps 20 are raised. As a result, it is possible to connect interconnector 7 to light-receiving-side output electrode 61 of solar cell element 6. Note that connection between interconnector 7 and backside output electrode 63 may be carried out using a similar method.

By respectively soldering interconnectors 7 to light-receiving-side output electrode 61 and backside output electrode 63 of solar cell element 6 in this manner, it is possible to mutually electrically connect a prescribed number of solar cell elements 6.

Finally, first filler material 4, a plurality solar cell elements 6 mutually connected by interconnector(s) 7, second filler material 5, and back sheet 3 are sequentially stacked over translucent substrate 2 to fabricate a module base. The module base is placed in a laminator and is degassed and is heated and subjected to pressure so as to form an integral structure, as a result of which solar cell module 1 is fabricated.

Because solar cell module 1 manufactured in accordance with the present embodiment is provided with interconnector(s) 7 which have been subjected to correction of in-plane bending as described above, it is possible to reduce the tendency for soldered area to be inadequate as well as for external appearance to deteriorate and/or efficiency of electric power generation to be lowered due to meandering of interconnector(s) 7. As a result, it is possible to achieve improved efficiency of electric power generation and improved reliability at solar cell module 1.

Second Embodiment

Next, referring to FIG. 10, solar cell module manufacturing device 30 according to a second embodiment of the present invention will be described.

Figure 10:
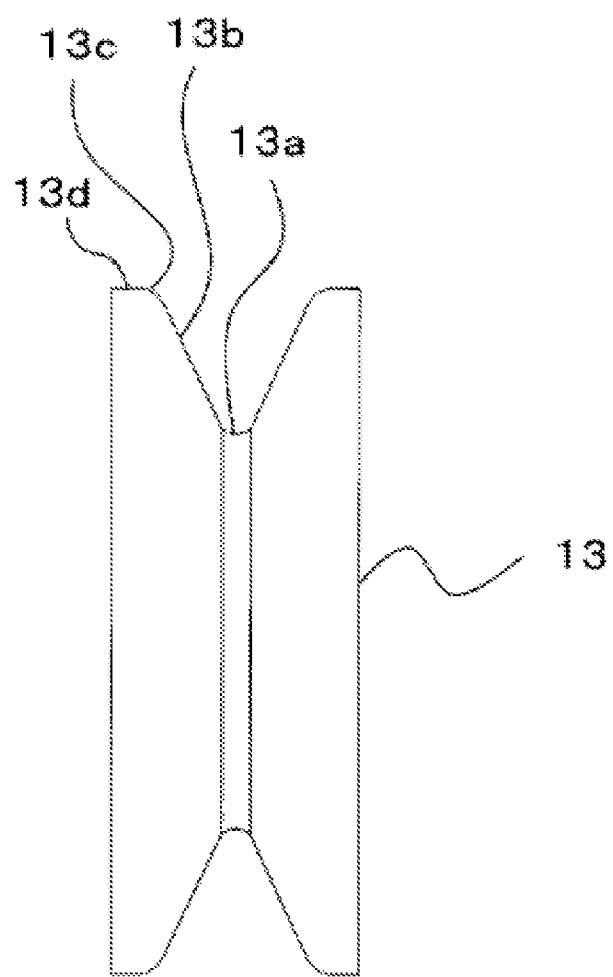
FIG. 10 is a plan view showing a first pulley in a solar cell module manufacturing device according to a second embodiment of the present invention.

As shown in FIG. 10, solar cell module manufacturing device 30 according to the present embodiment differs from the first embodiment with respect to the shape of first pulley 13.

More specifically, in the present embodiment, first peripheral end portion 13c of first pulley 13 is a curved surface. Here, as shown in FIG. 10, first peripheral end portion 13c refers to the location at which first inclined surface 13b and outside circumferential surface 13d of first pulley 13 mutually intersect.

As a result of adoption of such constitution, it is possible to reduce the tendency for folding of wiring material 11 to occur even when wiring material 11 interferes with first peripheral end portion 13c.

Moreover, in the present embodiment, first basal surface 13a is a curved surface. As a result of adoption of such constitution, it is possible to reduce friction between wiring material 11 and first groove 91, and it is possible to reduce occurrence of work hardening of wiring material 11. At such time, first basal surface 13a may have a mirror finish as described above.

Note that the shape of first pulley 13 in the present embodiment may be applied to second pulley 14.

Third Embodiment

Next, referring to FIG. 11, solar cell module manufacturing device 40 according to a third embodiment of the present invention will be described.

Figure 11:
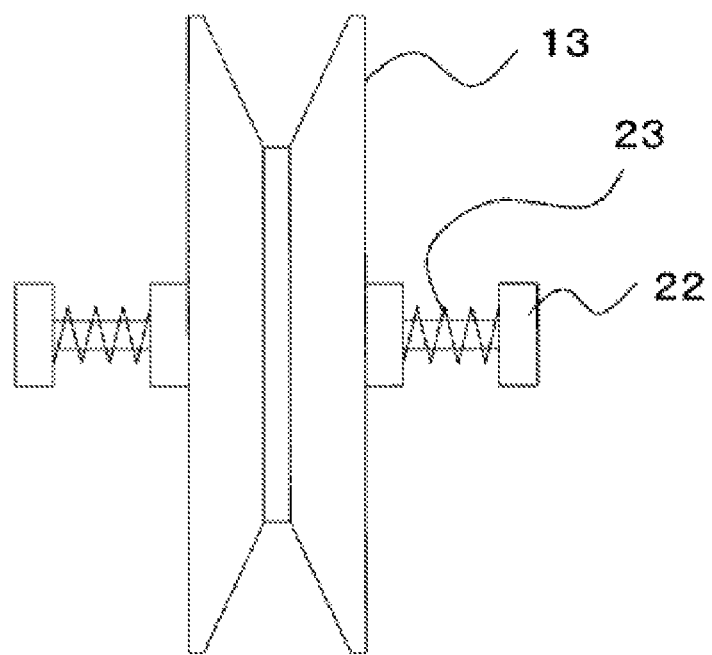
FIG. 11 is a plan view showing a first pulley in a solar cell module manufacturing device according to a third embodiment of the present invention.
Figure 11:
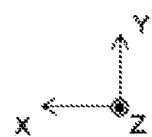

As shown in FIG. 11, solar cell module manufacturing device 40 according to the present embodiment differs from the first embodiment with respect to the constitution of first pulley 13.

More specifically, in the present embodiment, first pulley 13 is capable of movement in the X direction. More specifically, in the present embodiment, spring(s) 23 are provided at shaft portion(s) 22 arranged in the X direction at first pulley 13. This makes it possible for first pulley 13 to be capable of movement in the X direction.

As a result of adoption of such constitution, it is possible for first pulley 13 to move in correspondence to the position of wiring material 11 which is drawn from bobbin 12 and which is entrained by first pulley 13. This being the case, even where width (i.e., dimension in a direction parallel to axis $S_{12}$) of bobbin 12 is large, it will be possible to correct curvature of wiring material 11 in the in-plane direction without the need to replace first pulley 13. That is, versatility of first pulley 13 is increased.

While embodiments of the present invention have been described above in terms of examples, the present invention is not limited to the foregoing embodiments, as it goes without saying that modification may be carried out as desired without departing from the object of the present invention. Furthermore, it goes without saying that included within the scope of the present invention are various combinations of the embodiments that have been described above.

For example, solar cell element 6 is not limited to monocrystalline or polycrystalline silicon or other such crystalline solar cells, application to thin-film-type solar cell modules, chemical-compound-type solar cell modules, and the like which are connected by interconnector(s) 7 also being possible.

Furthermore, besides eutectic tin-lead solder and the like, for example, lead-free solder may be used as solder for soldering interconnector(s) 7.

| EXPLANATION OF REFERENCE NUMERALS | |
| --- | --- |
| 1: | Solar cell module |
| 2: | Translucent substrate |
| 3: | Back sheet |
| 4: | First filler material |
| 5: | Second filler material |
| 6: | Solar cell element |
| 6a: | First solar cell element |
| 6b: | Second solar cell element |
| 61: | Light-receiving-side output electrode |
| 62: | Finger electrode |
| 63: | Backside output electrode |
| 64: | Light-receiving surface |
| 65: | Back surface |
| 7: | Interconnector |
| 8: | Frame |
| 10, 30, 40: | Solar cell module manufacturing device |
| 11: | Wiring material |
| 12: | Bobbin |
| 12a: | End portion |
| 13: | First pulley |
| 13a: | First basal surface |
| 13b: | First inclined surface |

| | EXPLANATION OF REFERENCE NUMERALS |
|---|---|
| 13c: | First peripheral end portion |
| 13d: | Outside circumferential surface |
| 14: | Second pulley |
| 14a: | Second basal surface |
| 14b: | Second inclined surface |
| 14c: | Second peripheral end portion |
| 15: | Third pulley |
| 15a: | Third basal surface |
| 15b: | Wall surface |
| 16: | Immobilizing means |
| 17: | Cutting means |
| 17a: | Cutter |
| 17b: | Cutting die |
| 18: | Pulling means |
| 20: | Retaining clamp |
| 21: | Nozzle |
| 22: | Shaft portion |
| 23: | Spring |
| 51: | Supply portion |
| 52: | Correction portion |
| 53: | Cutting portion |
| 91: | First groove |
| 92: | Second groove |
| 93: | Third groove |

The invention claimed is:

1. A solar cell module manufacturing device comprising:
a supply portion that draws wiring material from a bobbin on which the wiring material is wound;
a correction portion that corrects curvature of the wiring material which has been drawn from the supply portion; and
a cutting portion that cuts the wiring material, which has been corrected, to prescribed length to form an interconnector;
wherein the correction portion comprises a first pulley that comes in contact with the wiring material which is drawn from the bobbin; and
wherein the first pulley comprises at a periphery thereof a first groove comprising: a first basal surface; and a pair of first inclined surfaces which are arranged on both sides of the first basal surface, an inclination angle $\theta_1$ of the first inclined surface relative to the first basal surface being less than or equal to an inclination angle $\theta_2$ of the wiring material which is drawn from the supply portion relative to the first basal surface.

2. The solar cell module manufacturing device according to claim 1, wherein a rotational axis of the first pulley is arranged so as to be more or less parallel to a rotational axis of the bobbin.

3. The solar cell module manufacturing device according to claim 1, wherein
the correction portion further comprises a second pulley which comes in contact with the wiring material after the first pulley;
the second pulley comprises at a periphery thereof a second groove comprising: a second basal surface; and a pair of second inclined surfaces which are arranged to both sides of the second basal surface, and
an inclination angle $\theta_3$ of the second inclined surface relative to the second basal surface is greater than the inclination angle $\theta_1$.

4. The solar cell module manufacturing device according to claim 3, wherein a rotational axis of the second pulley is arranged so as to be more or less parallel to a rotational axis of the bobbin.

5. The solar cell module manufacturing device according to claim 3, wherein a width of the second basal surface is more or less equal to a width of the first basal surface.

6. The solar cell module manufacturing device according to claim 5 wherein a width of the second groove is smaller than a width of the first groove.

7. The solar cell module manufacturing device according to claim 1, wherein
in the vertical direction, the first pulley is arranged below both the bobbin and the second pulley, and
in the vertical direction, a position of the first pulley relative to the bobbin is movable, but the position of the second pulley relative to the bobbin is stationary.

8. The solar cell module manufacturing device according to claim 3, wherein
the correction portion further comprises a third pulley which comes in contact with the wiring material after the second pulley but before the cutting portion, and
the third pulley comprises at a periphery thereof a third groove comprising: a third basal surface; and a pair of wall surfaces which are arranged to both sides of the third basal surface so as to be more or less perpendicular to the third basal surface.

9. The solar cell module manufacturing device according to claim 8, wherein a rotational axis of the third pulley is arranged so as to be more or less parallel to a rotational axis of the bobbin.

10. The solar cell module manufacturing device according to claim 8, wherein a width of the third basal surface is more or less equal to a width of the second basal surface.

11. The solar cell module manufacturing device according to claim 10, wherein a width of the third groove is smaller than a width of the second groove.

12. The solar cell module manufacturing device according to claim 11, wherein the width of the second groove is smaller than the width of the first groove but is larger than the width of the third groove.

13. The solar cell module manufacturing device according to claim 1, wherein an inclination angle $\theta_4$ of the first inclined surface relative to an outside circumferential surface of the first pulley is an obtuse angle.

14. A solar cell module manufacturing method, comprising:
a supply step in which wiring material is drawn from a bobbin on which the wiring material is wound;
a correction step in which curvature of the wiring material which has been drawn is corrected; and
a cutting step in which the wiring material, which has been corrected, is cut to prescribed length to form an interconnector;
wherein the correction step comprises a first step in which correction of curvature is carried out by making the wiring material come in contact with a first pulley that comprises at a periphery thereof a first groove comprising: a first basal surface; and a pair of first inclined surfaces which are arranged on both sides of the first basal surface, and
wherein, in the first step, curvature in a width direction of the wiring material is corrected by making the wiring material come in contact with the first basal surface and not in contact with a peripheral end portion of the first inclined surface.

15. The solar cell module manufacturing method according to claim 14, wherein
the correction step further comprises a second step in which correction of curvature is carried out by making the wiring material, which has traveled past the first pulley, come in contact with a second pulley that comprises at a periphery thereof a second groove comprising: a second basal surface; and a pair of second inclination which are arranged on both sides of the second basal surface;

wherein a rotational axis of the first pulley and a rotational axis of the second pulley are each arranged so as to be more or less parallel to a rotational axis of the bobbin; and wherein, in the second step, an inclination angle $\theta_3$ of the second inclined surface relative to the second basal surface is greater than an inclination angle $\theta_1$ of the first inclined surface relative to the first basal surface.

16. The solar cell module manufacturing method according to claim 15, wherein, in the second step, curvature of the wiring material in a width direction and in a length direction is corrected.

17. The solar cell module manufacturing method according to claim 14, wherein the correction step further comprises a third step in which feed direction of the wiring material, which has been corrected, is adjusted.

18. The solar cell module manufacturing method according to claim 14, wherein, in the first step, tension of the wiring material which is produced when the wiring material is drawn from the bobbin is used for rotary motion of the first pulley in a length direction of the wiring material.

* * * * *